(12) United States Patent
Ni et al.

(10) Patent No.: US 7,804,315 B2
(45) Date of Patent: Sep. 28, 2010

(54) PROBE CARD

(75) Inventors: Cheng-Chin Ni, Hsinchu (TW); Kun Chou Chen, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 31 days.

(21) Appl. No.: 12/453,257

(22) Filed: May 5, 2009

(65) Prior Publication Data
US 2010/0182028 A1    Jul. 22, 2010

(30) Foreign Application Priority Data
Jan. 22, 2009    (TW)    .............................. 98102477 A

(51) Int. Cl.
*G01R 31/02*    (2006.01)
(52) U.S. Cl. ..................................... 324/754
(58) Field of Classification Search ................ 324/754, 324/761–762, 765, 760, 158.1; 439/480, 439/482; 438/14–48
See application file for complete search history.

(56) References Cited

U.S. PATENT DOCUMENTS 4,567,433 A * 1/1986 Ohkubo et al. .............. 324/762
7,595,651 B2 * 9/2009 Ku et al. ..................... 324/754

* cited by examiner

*Primary Examiner*—Ha Tran T Nguyen
*Assistant Examiner*—Tung X Nguyen
(74) *Attorney, Agent, or Firm*—Bacon & Thomas, PLLC

(57) ABSTRACT

A probe card is disclosed, which has a conductive layer additionally provided on an insulating seat of a probe stand and the conductive layer is electrically connected to a ground circuit on the probe card via a conductive pin being fed through the insulating seat. A conductive wire is wound surrounding the intermediate segment of the probe, one end of the conductive wire is electrically connected to the ground circuit of the circuit board, and the other end of the conductive wire is electrically connected to the conductive layer of the probe stand. Thus, due to that an additional ground portion of the conductive layer is provided on the conductive wire wound surrounding the probe, a loop inductance of the probe in the insulating seat can be reduced such that accuracy of test data of the probe can be enhanced.

6 Claims, 5 Drawing Sheets

PROBE CARD

BACKGROUND OF THE INVENTION

1. Field of the Invention

The present invention relates to a probe card and, more particularly, to a probe card having a conductive layer.

2. Background of the Invention

In processing wafers of semiconductor, to determine if dies on a wafer are good or bad, a test bench and a probe card are required to perform test of the wafer. It is provided on the probe card precise a contact mechanism to contact each die on the wafer and a conduction circuit to perform electrical test, so as to assure that the electrical properties and performance of the dies are manufactured according to the design specification.

Recently, development of high speed semiconductor devices is becoming popular. The test bench and the probe card should be operated in high frequency to accommodate the tendency. However, as a conventional probe card of a suspension arm type is applied to the high frequency test, the test result will not be very stable, quite often due to noise produced by electromagnetism interference resulting from extreme proximity of adjacent probes, such that additional test procedures are required, rendering degradation of the efficiency of production and the test.

Please refer to FIGS. 1 and 2. FIG. 1 is a three-dimensional diagram of a conventional probe card. FIG. 2 is a cross-sectional diagram of the conventional probe card. As shown in the drawings, a probe card 9 comprises a circuit board 91, a probe stand 92, a plurality of probes 93 and a plurality of conductive wires 94, in which the circuit board 91 includes an inner ring ground wire 95 and an outer ring ground wire 96, and each of the plurality of probes 93 includes a convex portion 931, an embedded portion 932 and a connection portion 933.

The probes 93 may be divided into three kinds, i.e. a high frequency signal probe, a power probe and a ground probe. Only for the high frequency signal probe and the power probe, one conductive wire 94 has to be wound surrounding the connection portion 933 of each of the plurality of probes 93 correspondingly. One end of each of the plurality of conductive wires 94 is respectively electrically connected to the inner ring ground wire 95 of the circuit board 91, and the other end of each of the plurality of conductive wire 94 is respectively electrically connected to the outer ring ground wire 96 of the circuit board 91.

Based on the principle of a current loop, due to the winding of one conductive wire 94 surrounding the connection portion 933 of each probe 93, the inner ring ground wire 95 may be extended and connected to the outer ring ground wire 96, such that the ground circuit of the probe card 9 is approaching closely to the connection portion 933 of each probe 93, rendering the loop inductance of the connection portion 933 to become smaller.

As shown in FIG. 2, the embedded portion 932 of each probe 93 is embedded into the probe stand 92. Since the conductive wire 94 only covers the connection portion 933 of each probe 93, the embedded portion 932 of each probe 93 is spaced apart a farther distance from the ground circuit, such that the loop inductance formed by the embedded portion 932 of each probe 93 is getting bigger, which will cause test signals between a chip to be tested and the probe card 9 during a test period not to transfer completely, thereby affecting accuracy of the test data.

Therefore, it is desirable to provide an improved probe card, in which the high frequency noise produced in the embedded portion 932 of each probe 93 may be removed from the internal portion of the probe stand 92, so as to mitigate and/or obviate the aforementioned problems.

SUMMARY OF THE INVENTION

To achieve the above object, the present invention provides a probe card, comprising a circuit board, a probe stand, at least a probe and at least a conductive wire.

The circuit board includes a test circuit and a ground circuit. The probe stand includes an insulating seat, a conductive layer and at least a conductive pin, in which one surface of the insulating seat is fixed on the circuit board, the other surface thereof is provided with the conductive layer, the at least a conductive pin is fed through the insulating seat, and the conductive layer is electrically connected to the ground circuit of the circuit board via the at least a conductive pin. The at least a probe includes an inner core and an insulating layer wrapped outside. The at least a probe provides a first end, an intermediate segment and a second end, in which the first end is electrically connected to the test circuit of the circuit board, at least a portion of the intermediate segment is fixed in and piercing through an internal part of the insulating seat, and the second end is protruded from the insulating seat and exposed outside. The at least a conductive wire is wound surrounding the intermediate segment of the at least a probe, in which one end of the at least a conductive wire is electrically connected to the ground circuit of the circuit board, and the other end of the at least a conductive wire is electrically connected to the conductive layer of the probe stand.

Based on the principle of the current loop, the ground circuit formed cooperatively by the conductive wire and the conductive layer extends to cover a longer range of the probe, such that the loop inductance of the probe in the insulating seat can be reduced and thus the accuracy of the test data of the probe can be raised. The at least a probe may include a signal probe which refers to a high frequency signal transmission probe. The at least a probe may include a power probe. The insulating seat of the probe stand is a hollow body and the conductive layer is a thin layer of a hollow ring. The insulating seat of the probe stand may be an epoxy seat, a ceramic seat or an insulating one with equivalent material.

Other objects, advantages, and novel features of the invention will become more apparent from the following detailed description when taken in conjunction with the accompanying drawings.

DETAILED DESCRIPTION OF THE INVENTION

Figure 1:
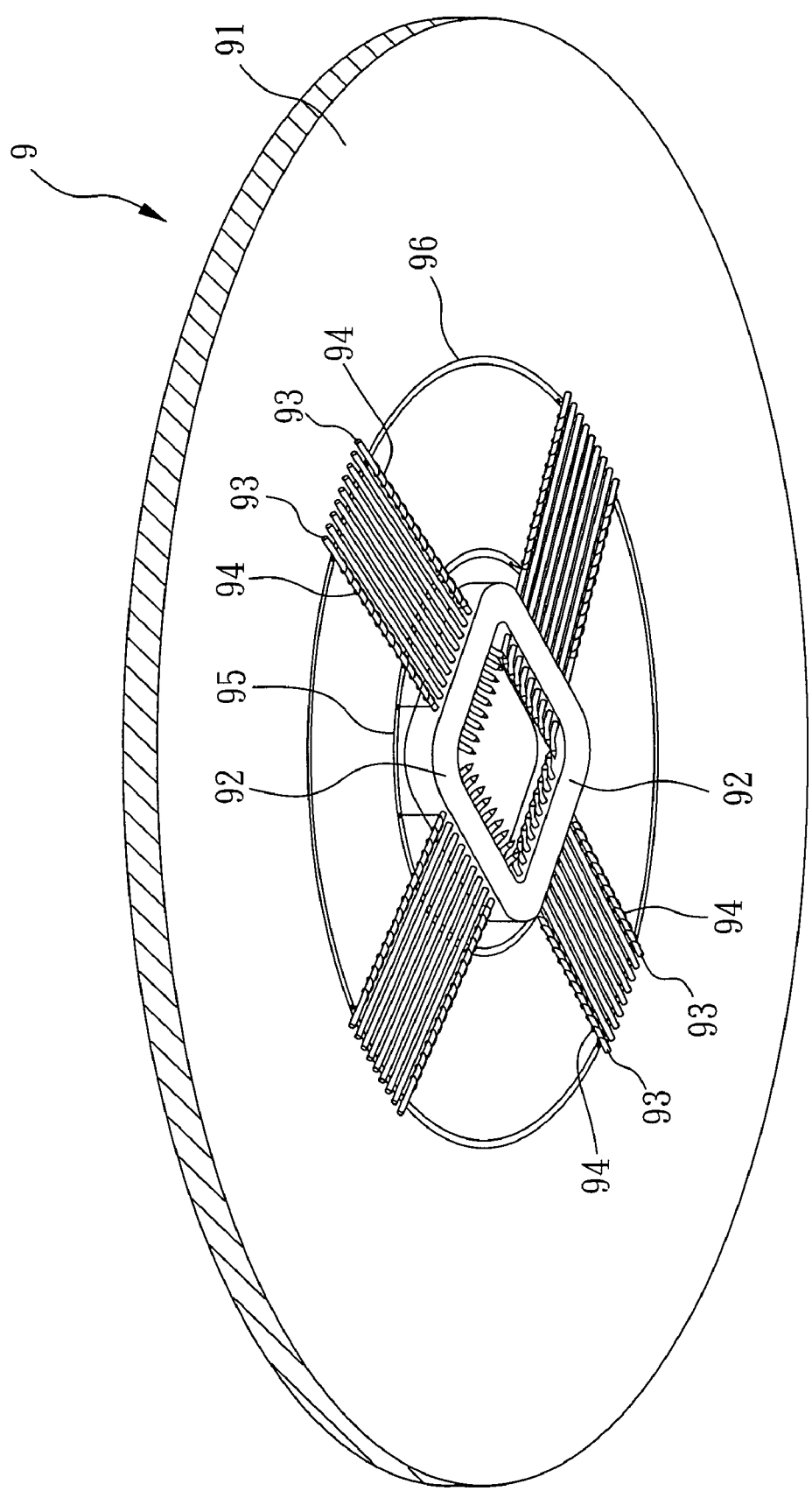
FIG. 1 is a three-dimensional diagram of a conventional probe card.
Figure 2:
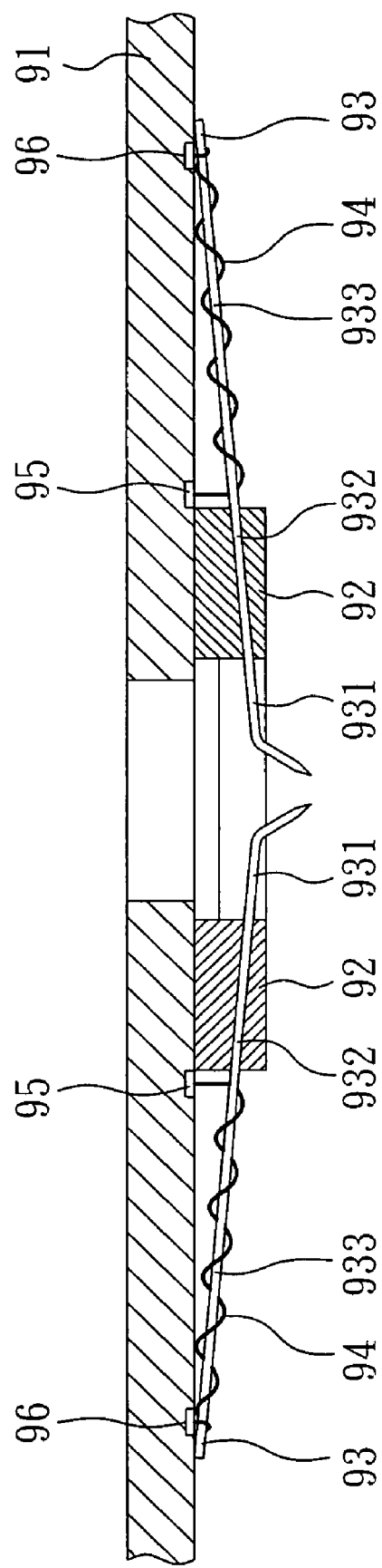
FIG. 2 is a cross-sectional diagram of the conventional probe card.
Figure 3:
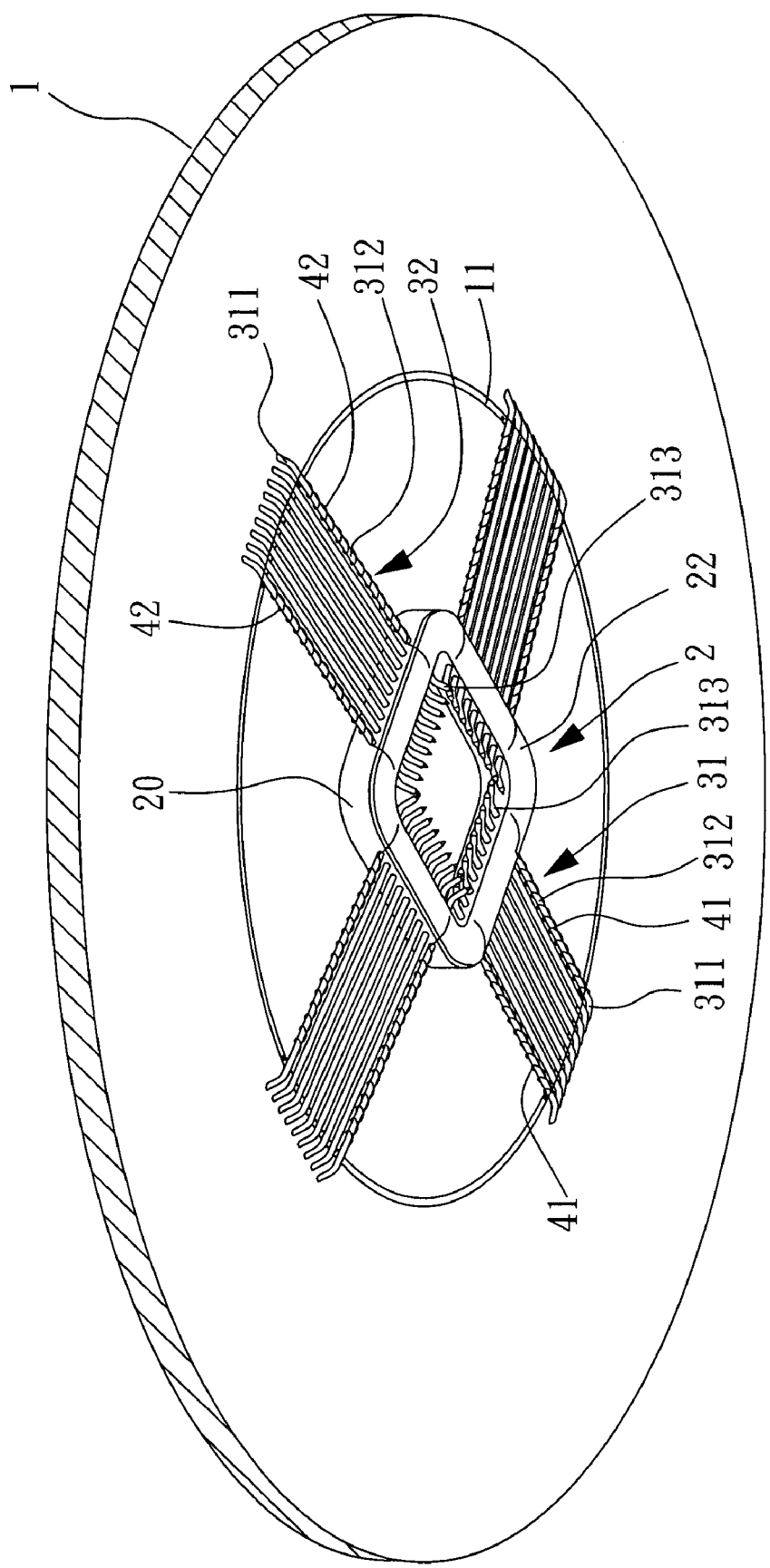
FIG. 3 is a three-dimensional diagram of a preferred embodiment of a probe card of the invention.
Figure 4:
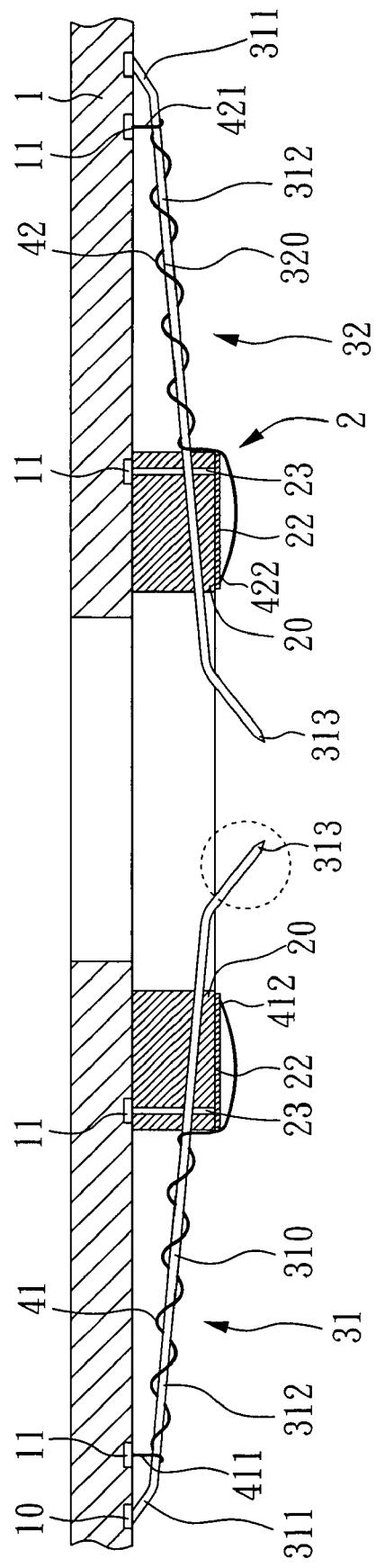
FIG. 4 is a cross-sectional diagram of the preferred embodiment of the probe card of the invention.

Please refer to FIG. 3 and FIG. 4 concurrently. FIG. 3 is a three-dimensional diagram of a preferred embodiment of a probe card of the invention. FIG. 4 is a cross-sectional diagram of the preferred embodiment of the probe card of the invention.

As shown in the drawings, the present invention provides a probe card, comprising a circuit board 1, a probe stand 2, at least a probe 31, 32 and at least a conductive wire 41, 42.

The circuit board 1 includes a test circuit 10 and a ground circuit II. The probe stand 2 includes an insulating seat 20, a conductive layer 22 and at least a conductive pin 23, in which one surface of the insulating seat 20 is fixed on a central portion of the circuit board 1 and the other surface thereof is provided with the conductive layer 22. The insulating seat 20 of the probe stand 2 is a hollow body and the conductive layer 22 is a thin layer of a hollow ring. In addition, the insulating seat 20 of the probe stand 2 may be an epoxy seat. The at least a conductive pin 23 is fed through the insulating seat 20, and the conductive layer 22 is electrically connected to the ground circuit 11 of the circuit board 1 via the at least a conductive pin 23.

Figure 5:
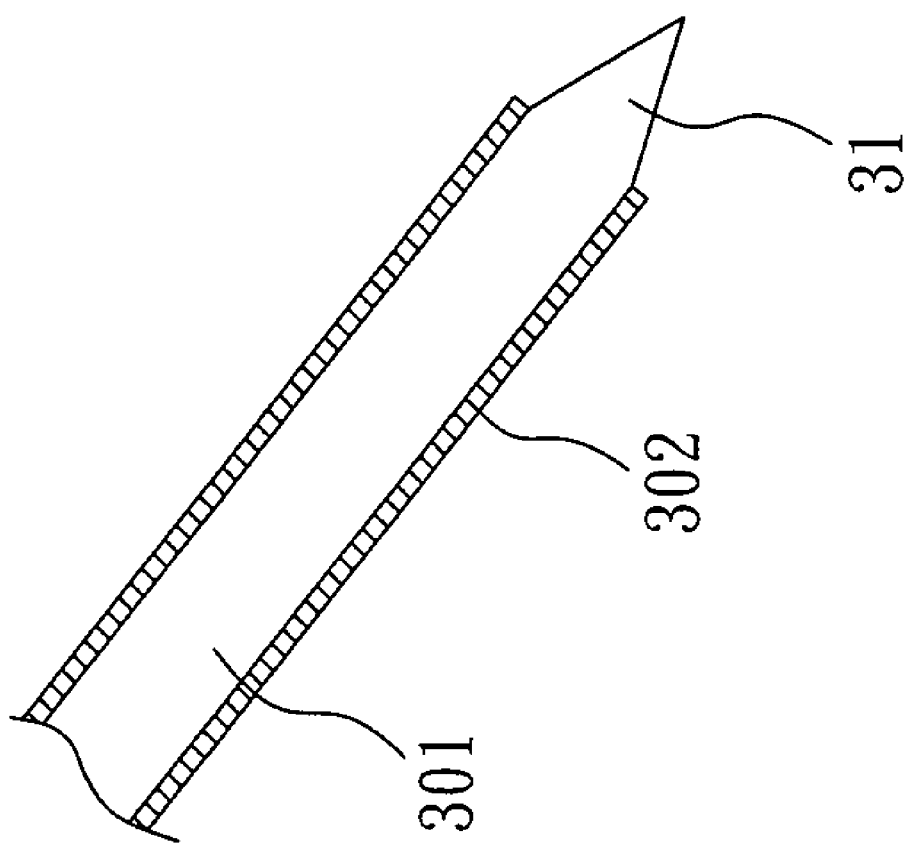
FIG. 5 is a cross-sectional diagram of a preferred embodiment of a probe of the invention.

Please refer to FIGS. 3, 4 and 5 concurrently. FIG. 5 is a cross-sectional diagram of a preferred embodiment of a probe of the invention. As shown in FIG. 5, a probe 31 includes an inner core 301 and an insulating layer 302 wrapped outside.

As shown in FIGS. 3 and 4, the at least a probe 31, 32 provides a first end 311, an intermediate segment 312 and a second end 313, in which the probe 31 includes a signal probe 310, referring to a high frequency signal transmission probe, and the probe 32 includes a power probe 320.

The first end 311 is electrically connected to the test circuit 10 of the circuit board 1, at least a portion of the intermediate segment 312 is fixed in and piercing through an internal part of the insulating seat 20 of the probe stand 2, and the second end 313 is protruded from the insulating seat 20 and exposed outside, for facilitating electrical contact with a wafer to be tested.

The conductive wire 41 and the conductive wire 42 are respectively wound surrounding the intermediate segment 312 respectively of the probe 31 and the probe 32, in which one end 411 of the conductive wire 41 is electrically connected to the ground circuit 11 of the circuit board 1 and the other end 412 of the conductive wire 41 is electrically connected to the conductive layer 22 of the probe stand 2, and one end 421 of the conductive wire 42 is electrically connected to the ground circuit II of the circuit board 1, and the other end 422 of the conductive wire 42 is electrically connected to the conductive layer 22 of the probe stand 2.

Based on the principle of the current loop, the ground circuit respectively formed by the conductive wires 41 and 42 is in close proximity respectively to the probes 31 and 32 respectively in the insulating seat 20 such that the loop inductance respectively of the probes 31 and 32 in the insulating seat 20 can be reduced and thus the accuracy of the test data of the probes 31 and 32 can be enhanced.

Although the present invention has been explained in relation to its preferred embodiment, it is to be understood that many other possible modifications and variations can be made without departing from the scope of the invention as hereinafter claimed.

What is claimed is:

1. A probe card, comprising:
   a circuit board, including a test circuit and a ground circuit;
   a probe stand, including an insulating seat, a conductive layer and at least a conductive pin, one surface of the insulating seat being fixed on the circuit board, the other surface thereof being provided with the conductive layer, the at least a conductive pin being fed through the insulating seat, and the conductive layer being electrically connected to the ground circuit of the circuit board via the at least a conductive pin;
   at least a probe, including an inner core and an insulating layer wrapped outside, the at least a probe providing a first end, an intermediate segment and a second end, the first end being electrically connected to the test circuit of the circuit board, at least a portion of the intermediate segment being fixed in and piercing through an internal part of the insulating seat, and the second end being protruded from the insulating seat and exposed outside; and
   at least a conductive wire, being wound surrounding the intermediate segment of the at least a probe, one end of the at least a conductive wire being electrically connected to the ground circuit of the circuit board, and the other end of the at least a conductive wire being electrically connected to the conductive layer of the probe stand.

2. The probe card as claimed in claim 1, wherein the at least a probe includes a signal probe.

3. The probe card as claimed in claim 2, wherein the signal probe is a high frequency signal transmission probe.

4. The probe card as claimed in claim 1, wherein the at least a probe includes a power probe.

5. The probe card as claimed in claim 1, wherein the insulating seat of the probe stand is a hollow body and the conductive layer is a thin layer of a hollow ring.

6. The probe card as claimed in claim 1, wherein the insulating seat of the probe stand is an epoxy seat.

* * * * *